(12) United States Patent
Vij

(10) Patent No.: US 6,498,489 B1
(45) Date of Patent: Dec. 24, 2002

(54) MAGNETIC RESONANCE IMAGING COIL ARRAYS WITH SEPARABLE IMAGING COIL ELEMENTS

(76) Inventor: Kamal Vij, 5791 W. Gail Dr., Chandler, AZ (US) 85226

( * ) Notice: Subject to any disclaimer, the term of this patent is extended or adjusted under 35 U.S.C. 154(b) by 0 days.

(21) Appl. No.: 09/849,217

(22) Filed: May 4, 2001

(51) Int. Cl.⁷ .................................................. G01V 3/00
(52) U.S. Cl. ....................................... 324/322; 324/318
(58) Field of Search ................................ 324/322, 318, 324/300, 306, 307, 309, 312, 314

(56) References Cited

U.S. PATENT DOCUMENTS

| | | | |
|---|---|---|---|
| 4,727,328 A | * 2/1988 | Carper et al. | ................ 324/318 |
| 4,733,190 A | * 3/1988 | Dembinski | ................ 324/222 |
| 4,825,162 A | 4/1989 | Roemer | |
| 4,885,541 A | 12/1989 | Hayes | |
| 5,435,302 A | 7/1995 | Lenkinski | |
| 5,477,146 A | 12/1995 | Jones | |
| 5,682,098 A | 10/1997 | Vij | |
| 5,850,143 A | * 12/1998 | Schubert et al. | ............ 324/318 |
| 5,905,378 A | 5/1999 | Giaquinto | |
| 6,084,411 A | 7/2000 | Giaquinto | |

OTHER PUBLICATIONS

Roemer et al., The NMR Phased Array, Magnetic Resonance in Medicine, vol. 16, p. 192–225, 1990, Academic Press.

* cited by examiner

Primary Examiner—Louis Arana

(57) ABSTRACT

An apparatus for assembling a magnetic resonance imaging (MRI) coil array using separable imaging coil elements and a cable holder for connecting the imaging coil elements to the MRI scanner. Each imaging coil element has a plug shaped connector, which is used for separably connecting to a mating receptacle interface on the cable holder. Each cable holder is pre-formed for a particular anatomy and has receptacle interfaces that are located for optimal placement of imaging coil elements. Ultra-low input impedance preamplifiers are used for minimizing interaction between imaging coil elements. This gives users greater freedom in optimizing position of individual imaging coil elements, as overlapping of adjacent coil elements is not required. Imaging coil elements from one coil array can be easily removed and used in assembling a different coil array.

15 Claims, 7 Drawing Sheets

MAGNETIC RESONANCE IMAGING COIL ARRAYS WITH SEPARABLE IMAGING COIL ELEMENTS

CROSS-REFERENCE TO RELATED APPLICATIONS

Not Applicable

STATEMENT REGARDING FEDERALLY SPONSERED RESEARCH OR DEVELOPMENT

Not applicable

BACKGROUND—FIELD OF INVENTION

This invention relates to magnetic resonance imaging coils, specifically to such coils that are arrays comprising of multiple smaller coils.

BACKGROUND—DESCRIPTION OF PRIOR ART

In a typical magnetic resonance imaging (MRI) examination activity, an imaging coil is placed over the anatomy of interest and then the patient is placed inside a large magnet. The static field of the magnet aligns the protons in the patient's body in the direction of its magnetic field. A large whole body coil is used to generate high-energy (peak power 5–15KW) radio frequency (RF) pulses that excite protons in the patient. These protons relax back to their original state after the excitation is switched off At this time the scanner automatically switches 'ON' the imaging coil and turns the body coil 'OFF'. As the protons relax they induce minute RF signals in the imaging coils. These signals are picked up by the imaging coil and fed to a signal processing system from where the information is transferred to a computer for image reconstruction and display.

Signal to noise ratio (SNR) and field of view (FOV) are the two most important parameters for characterizing a MRI imaging coil. SNR is a measure of the sensitivity of the imaging coil and its intrinsic electric resistance. Higher the sensitivity of a coil greater is the signal voltage induced in the coil. A coil with higher intrinsic resistance generates more noise than the one with lower intrinsic resistance. FOV is a measure of the region over which the coil is sensitive enough to pick-up acceptable SNR signals. The ultimate MRI imaging coil can be defined as the one with the largest FOV and the highest SNR over that FOV.

Single loop imaging coil is the most basic MRI coil. For a single loop coil there is the diameter of the loop determines the SNR and the FOV of the coil. Larger the diameter of the coil larger is its FOV. However large diameter coils have higher intrinsic resistance because the induced currents have to travel over a longer conductor path along the circumference in comparison to a smaller diameter loop coil. Therefore, in the past, designers have had to optimize the diameter of such loop coils depending on the application and make a choice between SNR and FOV.

U.S. Pat. No. 4,825,162 describes a method for simultaneously receiving NMR signals from a plurality of closely-spaced imaging coils. This technique overcomes the tradeoff between SNR and FOV by using multiple small sized coils for simultaneous data acquisition. Such coils are commonly referred to as phased array coils or coil arrays. Depending on the anatomy several designs exist for these coil arrays. The most well known coil array is the four element spine array. As the name suggests this is made of four identical circular loops placed side by side in a line with adjacent loops slightly overlapping each other. Signals from each of these loops is acquired simultaneously and digitally recombined, such that a long FOV is generated. Such a FOV can be generated using a single loop coil with a much larger diameter. However the SNR would suffer as the large loop has lower sensitivity than each of the smaller loop coils. Thus, by recombining signals from an array of smaller coils it is possible to get high SNR as well as a large FOV.

When MRI coils that are tuned to the same radio frequency are brought together in close proximity as in phased array coils, they inductively couple to each other and detune each other. This results in image quality that is worse than what can be achieved when each coil is used by itself. Phase array coil technology overcomes this problem by slightly overlapping adjacent coils and by using specially designed preamplifiers that dampen the current flow in the individual coils.

In order to get the best image quality coil arrays are placed as close as possible to the anatomy under examination. The array housing is specially contoured to fit a particular part of the body such that the anatomy of interest lies well within the area of highest sensitivity of individual coil elements. Since the FOV needed for every application is different, the number and the type of elements used in a array coil vary from one array to the other. This leads to an MRI clinic investing in a unique array for every application, for example, a special spine array with a long FOV is used for spine imaging while a special knee array with much smaller FOV is used for knee imaging. A typical spine array has six imaging coil elements while a knee coil has only four elements.

During an MRI scan a patient can get burnt if the coaxial cable of the imaging coil loops over itself Large RF current can get induced in the loop from the RF energy transmitted by the body coil. Also, the cable it self can act like an antenna and have RF standing waves form on the outer shield of the coaxial line. All these can result in RF burns to the patient. These issues have been overcome by mechanically making cables less prone to looping, by using Baluns and RF traps to prevent any RF currents from flowing on the cable shield.

Cable burn issues are an even greater concern with phased arrays since there are as many cables as there are imaging coil elements. Care is taken to anchor the cable in special jackets to prevent them from looping. Additionally the coils them selves are anchored in preset location inside coil housing to minimize their interaction with each other and their cables. Individual coil overlap is preset during manufacture of the coil array and cannot be changed. Also, since all the elements of the array are together if one element or the cable assembly fails then the whole array is sent back to the factory for repair.

Phased array coils such as those described in U.S. Pat. No.: 6,084,411 and 5,905,378 restrict a user to coil arrangements in which adjacent coils elements have to be in a fixed predetermined overlap position in order to minimize inter-coil coupling locations and minimize the loss in SNR due to coupling. Coils that are not overlapped have to be physically separated at a minimal distance such that they do not couple to each other. This limits the configurations the device can be used in. For example, these coils cannot be used in a geometrically opposed manner in which two coils face each other without significantly degrading SNR. Further, the coils are isolated from the cables through tuned Baluns. Another drawback of using this approach is that the tuned Balun introduces an insertion loss that adds to the overall noise in the system. Also, this approach does not eliminate burns that can occur from a cable looping over it-self All the phased array coil heretofore known suffer from a number of disadvantages:

(1) they are all application specific coils with dedicated coil elements, (2) adjacent coil elements have to be overlapped in order to minimize interactions with each other, (3) coil elements are not removable or exchangeable between array configurations, (4) users have limited options for optimizing array configurations to match their needs and (5) if an individual coil element fails then the whole array assembly has to be sent for repairs.

The forgoing illustrates limitations known to exist in present phased array coils. It is apparent that it would be advantageous to provide an improved phased array coil, such as an array coil with separable imaging coil elements, and which is directed to overcoming one or more of the limitations set forth above. Accordingly, a suitable alternative is provided including features more fully disclosed hereinafter.

SUMMARY

The present invention creates a paradigm shift in the current art of MRI imaging coil arrays. In one aspect of the present invention, a user can assemble different array coils from a set of basic building blocks—imaging coil elements and cable holders. These imaging coil elements can be used over and over to form array coils of various shapes and sizes. Moreover, since these coil elements are not dependent on overlap for minimizing interaction with other coils, the users have considerable freedom in placing coil elements to better match each individual application. The ability to move the elements relative to each other allows the MRI technicians to determine an optimal position to get the best image quality. These coil elements can be configured in various planar as well as three-dimensional arrangements to form arrays that are optimized for SNR and FOV.

In one embodiment, individual coil elements can be directly connected via a quick disconnect connector to a pre-formed cable holder to form a coil array. The same coil elements can be reused over and again on a different cable holder to form a different array.

It is another purpose of this invention to improve patient safety and minimize the possibility of cable burns by restricting the movement of cables used for connecting individual coil elements to the MRI scanner.

It is another purpose of this invention to allow a user to make a cost effective investment in a few standard sized coil elements that can be reconfigured to form new coil arrays versus investing in several dedicated application specific arrays.

It is another objective of this invention to produce modular arrays that can be easily field serviced and maintained. Defective modules that are easy to identify and can be exchanged in the field instead of the entire array being sent back to the factory for repair.

BRIEF DESCRIPTION OF DRAWING FIGURES

The foregoing summary, as well as the following detailed description of a preferred embodiment of the invention will be better understood when read in conjunction with the appended drawings. For purpose of illustrating the invention, there is shown in the drawings an embodiment, which is presently preferred. It should be understood, however, that the invention is not limited to the precise arrangement and instrumentality shown. In the drawings.

DETAILED DESCRIPTION OF THE INVENTION

Figure 1A:
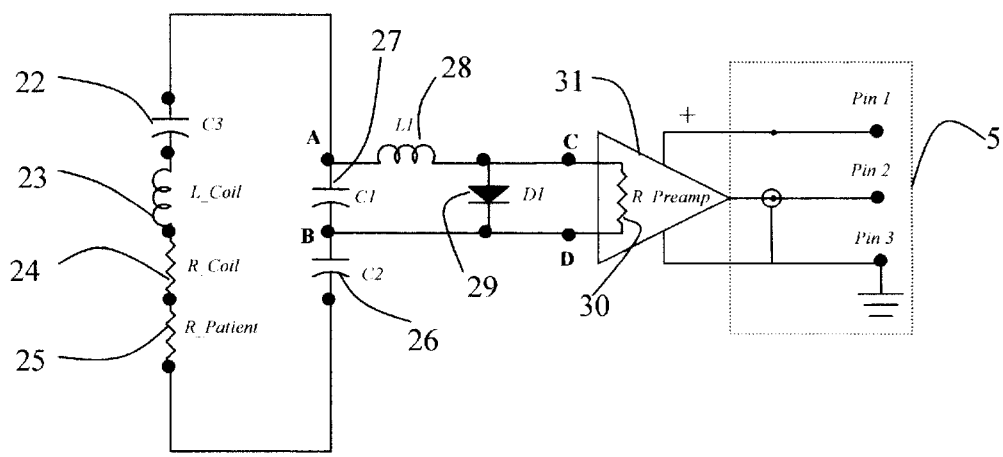
FIG. 1a illustrates the equivalent electrical schematic representation of a typical imaging coil element of the present invention.

A coil array of the present invention consists of multiple separable imaging coil elements. Each imaging coil elements is capable of independently receiving MRI radio frequency signals. A typical imaging coil element of the present invention can be closely modeled using an equivalent electrical circuit shown in FIG. 1. In this circuit capacitors C1 27, C2 26 and C3 22 resonate the imaging coil antenna inductance L_Coil 23 at the resonant frequency of protons. Resonant frequency of protons is 64 MHz in a 1.5 Tesla magnet. Patient loading loss introduced in the imaging coil is modeled as a resistor R_Patient 24 while the component losses are lumped together as R_Coil 25.

Inductor L1 28 has a dual function. During the MRI examination the scanner biases diode D1 29 'ON' whenever the body coil transmits. When PIN diode D1 29 is biased 'ON' it becomes close to a short circuit. Value of inductor L1 28 is selected such that it then resonates the capacitor C1 27 at the resonant MRI frequency. This results in high impedance across points A and B shown in the circuit diagram. Imaging coil element is thus open circuited when the D1 29 is biased 'ON'. When the imaging coil element is used for receiving MRI signals from the patient this diode is biased 'OFF' i.e. reverse biased. During receive mode inductor L1 28 also helps in matching the coil impedance to fifty ohms at the input of the preamplifier 31 shown by points C and D.

Preamplifier 31 has a ultra-low input impedance which is designated by resistor R_Preamp 30. This impedance, R_Preamp 30, has a very small value-typically one and a half ohms. This low impedance results in the inductor L1 28 resonating capacitor C1 27 and creating high impedance across point A and B even when D1 29 is biased 'OFF'. This impedance helps in minimizing current flow in the coil thereby reducing the effect of coupling of noise from one coil element to the other element in the array.

It is well known to those skilled in the art that for a single element the noise picked up by the element is due to the thermal noise from R_Patient+R_Coil. When a second identical imaging coil is brought close to the first element, noise from the second element couples into the first element. In such a case the thermal noise in the first imaging coil element increases to R_Patient+R_Coil+R12, where R12 is the extra noise resistance given by the following equation:

$$R12 = \frac{\omega^2 L\_Coil^2 K^2}{R\_Patient + R\_Coil + \frac{XC1^2}{R\_Preamp}} \quad (1)$$

Where, $\omega = 2\pi *$ (frequency of resonance)

K—is the coupling coefficient between two imaging coil elements

XC1—is the impedance of capacitor C1 at the resonant frequency

In order to minimize R12 adjacent coils are slightly overlapped in an array. Overlapping reduces the coupling coefficient K to nearly zero.

Alternatively, minimizing preamplifier impedance R_Preamp 30 can also minimize R12. Theoretically, if R_Preamp 30 is zero then R12 will also be zero. In this case, inter-coil coupling coefficient K can have larger values without any coupling of noise from one coil to the other.

Present invention allows the end users considerable freedom in relative positioning of the coil elements of the array. It relies on R_Preamp 30 to be small enough to minimize R12 effects while the inter-coil coupling coefficient K can have relatively higher values. R_Preamp 30 is designed to be less than 1.5 ohms. Each element of the present invention phased array coil has its own ultra-low input impedance preamplifier 31 which is mounted adjacent to the coil. Mounting the preamplifier 31 so close to the coil requires a small size, high stability and the use of nonmagnetic components. However, the advantage is that there is no additional cable loss which would otherwise increase the R_Preamp 30. As long as R_Preamp 30 is small the coil elements can tolerate higher inter-coil coupling without significant loss in SNR performance.

Figure 1B:
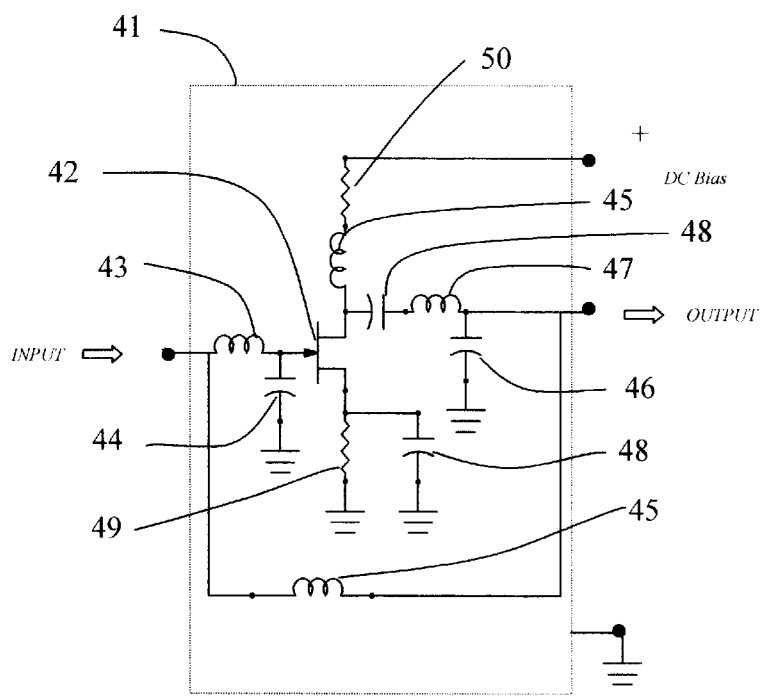
FIG. 1b illustrates the equivalent electrical schematic representation of a typical low impedance preamplifier of the present invention.

FIG. 1b illustrates the electrical schematic for the ultra-low input impedance preamplifier circuit used in present invention. Signal amplification is achieved using a low noise radio frequency transistor like a Gallium Arsenide Field Effect Transistor (GaAs FET) 42. Since the input impedance of the preamplifier is critical for de-coupling the imaging coil element, all the elements at the input of the transistor 42 have an ultra low resistive loss. The input matching inductor 43 is made from a low loss materials like oxygen free 16 AWG copper or silver wire. The matching inductor 43 design is optimized for minimal series resistance by adjusting the diameter and length of the inductor. A conductive shield 41 is used for isolating the sensitive preamplifier 31 electronics from external sources of noise. This conductive shield 41 which surrounds the components is kept at a minimal distance from the matching inductor 43. Typically, this distance is at least two times the diameter of the input inductor 43. Matching capacitor 44 is a low loss ceramic capacitor with a minimal Quality Factor of one thousand. Radio frequency choke 45 which provides a bypass path for the bias for the PIN diode 29, typically, has a minimal impedance of five kilo-ohms at the MRI signal frequency. The GaAs FET 42 is carefully selected for the highest input impedance, gain and stability at the MRI frequency. Rest of the components of the preamplifier are fairly standard and are well known to those skilled in the art.

Once inter-coil coupling is minimized and the weak signals picked by the coil elements amplified by the low input impedance preamplifier 31 there are several options for transmitting the signals to the main receiver. The simplest method is via a coaxial cable. Coil element shown in FIG. 1a is connected to the scanner using a quick disconnect plug shaped connector 5 that has a coaxial contact and a single pin. Pin 1 brings in the DC bias for the preamplifier while pin 2 which is the center pin of the coaxial connector brings in the center conductor of the coaxial cable. Pin 3, the outer shell of the coaxial connector, is connected to the system ground via the shield of the coaxial cable. Pin 2 carries both the RF output from the preamplifier 31 as well as the DC switching bias for the PIN diode 29 on the coil element. Since, the first stage of signal amplification is on the coil subsequent stages like the connector and the cable can have higher RF insertion loss without affecting the image SNR.

Figure 2A:
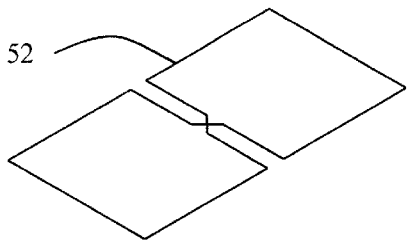
FIG. 2a illustrates the antenna geometry of a prior art loop antenna used in the loop shaped imaging coil elements of the present invention.
Figure 2B:
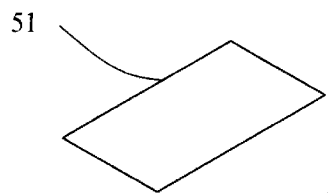
FIG. 2b illustrates the antenna geometry of a prior art figure eight shaped antenna used in the figure eight shaped imaging coil element of the present invention.
Figure 2C:
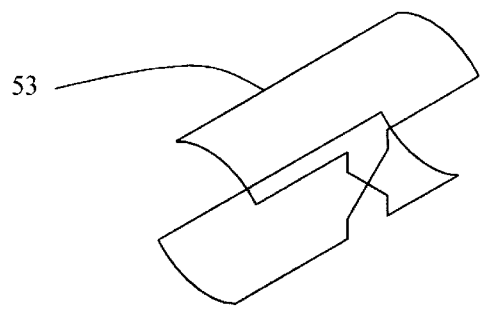
FIG. 2c illustrates the antenna geometry of a prior art saddle shaped antenna used in the saddle shaped imaging coil element of the present invention.

Most array coils are a combination of several closely placed loop antennas 51 or figure eight shaped antennas 52 or saddle shaped antennas 53. The individual geometry of the loop antenna, figure eight shaped antenna and saddle shaped antenna is illustrated in FIG. 2a, FIG. 2b and FIG. 2c respectively. These three antenna shapes have a different imaging volume associated with each of them. The loop antenna 51 produces flux that is perpendicular to the face of plane containing the loop. Loop antenna 51 has the highest sensitivity in the center of the loop and its sensitivity drops as one moves away from the loop. As a rule of thumb, for a circular loop, the useful imaging volume is restricted to a cylindrical volume defined by the perimeter of the loop and bound on either side of the plane containing the loop at a distance equal to the radius of the loop. A figure eight shaped antenna 52 produces flux that is parallel to the plane containing the antenna. This field is the strongest close to the coil but dies rapidly away from the coil. In conjunction with a loop antenna 51, the figure eight shaped antenna 52 is used to produce a quadrature field. A saddle shaped antenna 53 has a very homogenous imaging volume inside the cylindrical shape enclosed by the antenna. This makes this particular shape very useful for volume imaging application, example: wrist and knee imaging, where a homogenous field is desired over the entire enclosed cylindrical shaped volume. Thus, most of the phased array coil designs reported in literature till date are closely spaced clusters of various sized antennas made from above mentioned basic three antenna shapes. These basic shapes also form the building blocks of the present invention.

Figure 3A:
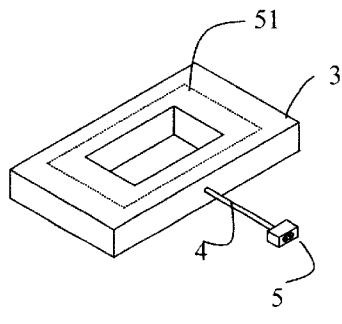
FIG. 3a illustrates an isometric view of a set comprising of three loop shaped imaging coil elements—small, medium and large.
Figure 3A:
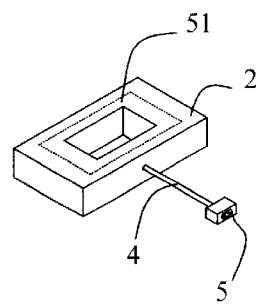
Figure 3A:
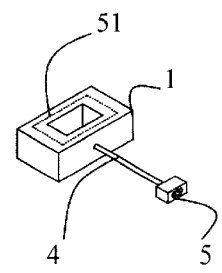
Figure 3B:
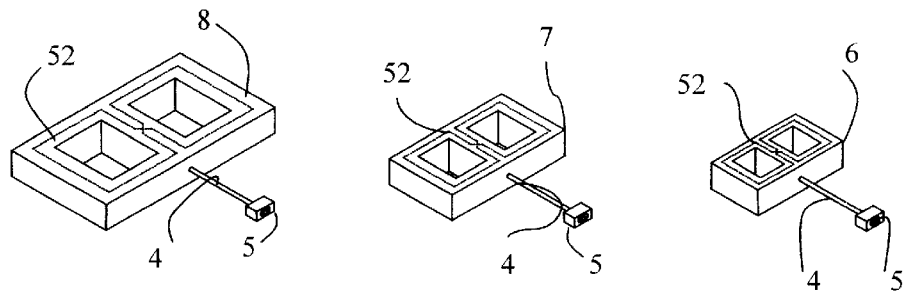
FIG. 3b illustrates an isometric view of a set comprising of three figure eight shaped imaging coil elements—small, medium and large.
Figure 3C:
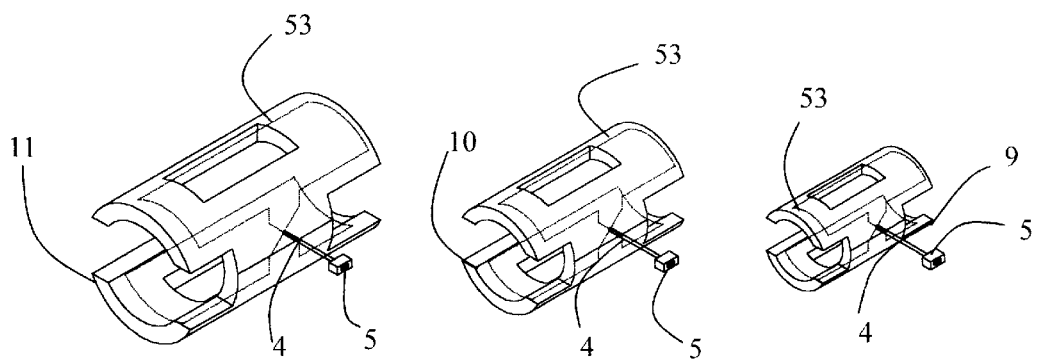
FIG. 3c illustrates an isometric view of a set comprising of three saddle shaped imaging coil elements—small, medium and large.

FIG. 3a shows three different sizes-small 1, medium 2 and large 3 of the preferred embodiment of the loop type imaging coil elements that are used in building the array coils of the present invention. The antenna used in the coil element is made from flexible conductive materials such as flexible circuit boards. The antenna is then molded in a soft polyurethane foam housing. All the antenna electronics shown in FIG. 1a, including the preamplifier, are enclosed within this flexible housing. Electrical connection to the imaging coil element is made through a short, 3 to 4 inch, cable assembly 4 that comes out of one side of the housing and is terminated into a quick-disconnect plug-shaped connector 5. Additional types of imaging coil elements used are shown in FIG. 3b and FIG. 3c. These are the figure eight shape and saddle shape imaging coil elements. Just like the loop coil elements they are also available in different sizes-small figure eight 6, medium figure eight 7, large figure eight 8, small saddle 9, medium saddle 10 and large saddle 11 shaped imaging coil element.

Figure 4:
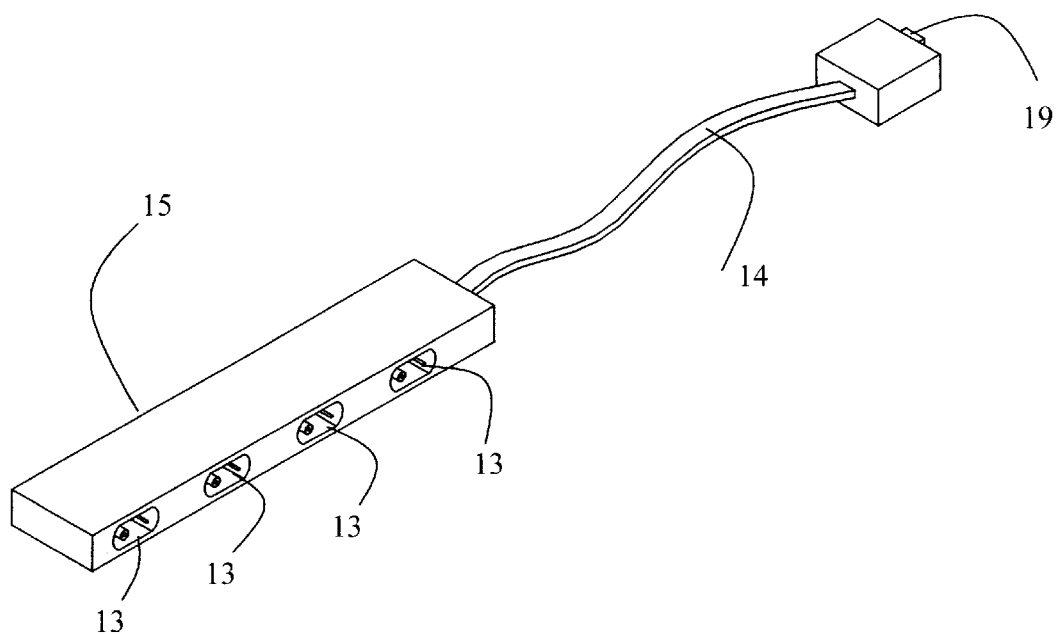
FIG. 4a illustrates an isometric view of a four-channel cable holder in which the mating connectors for individual coil elements are distributed along one dimension.
FIG. 4b illustrates an isometric view of the four-channel cable holder populated with saddle shaped imaging coil elements and setup for imaging a patient's leg.
Figure 4:
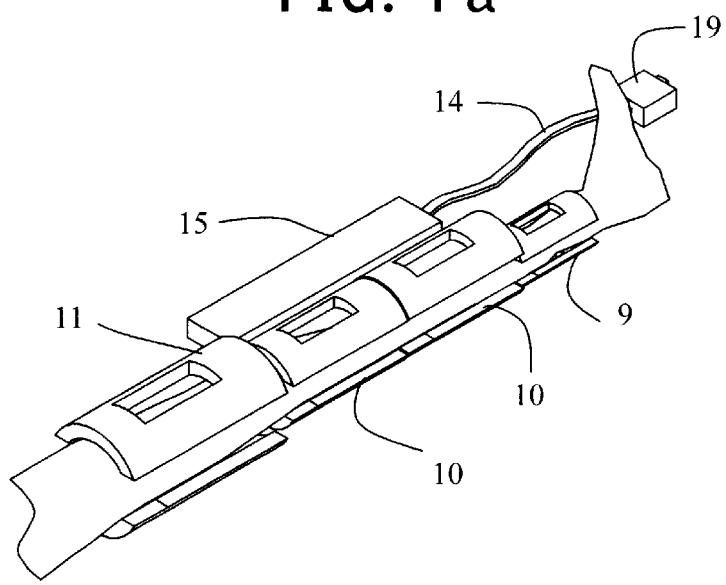

In one embodiment of the present invention, special cable holders are used for managing the various cables that connect the arrays to the MRI scanner. It is important for patient safety that the cables do not loop. Cable looping can cause RF burns. FIG. 4a illustrates a linear four channel cable holder. This holder has four mating receptacle-shaped connectors 13 for joining the plug-shaped connector 5 of an imaging coil element. The cable holder has a flexible flat cable section 14 and a stiffer semi-rigid front end 15. Semi-rigid front end 15 prevents the cable assembly from accidentally looping over it self Since the different cables for the individual coil elements emanate from this end it is designed to provide strain relief to rest of the cable assembly The cable holder connects to the MRI receiver through a system connector box 19.

Figure 5A:
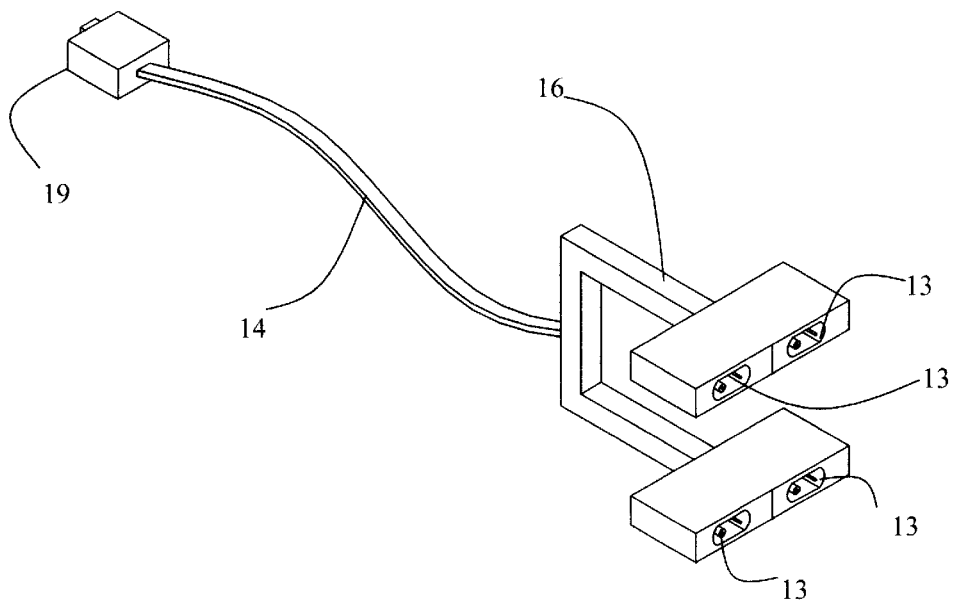
FIG. 5a illustrates an isometric view of a four-channel pelvic array cable holder.

The linear four channel cable holder can be used to assemble a lower extremity array coil using 4 saddle shaped imaging coil elements. FIG. 4b illustrates the lower extremity array setup on a patient's leg. This array comprises of a large saddle shaped imaging coil element 11 to go over the thigh, two medium saddle shaped imaging coil elements 10 to go over the knee and the calf area and a small saddle shaped imaging coil element 9 to go over the area between the calf and the ankle. Other different sized saddle shaped imaging coil element can be used to optimize this array for a given patient size. The same coil array could also be used with a loop type imaging coil element 3 and three saddle shaped imaging coil elements 11 to image the femoral artery from the pelvis to the knee. Similarly, the opposed pair cable holder shown in FIG. 5a can be used for forming a four channel pelvic array using four large loop coil elements 3.

Figure 5B:
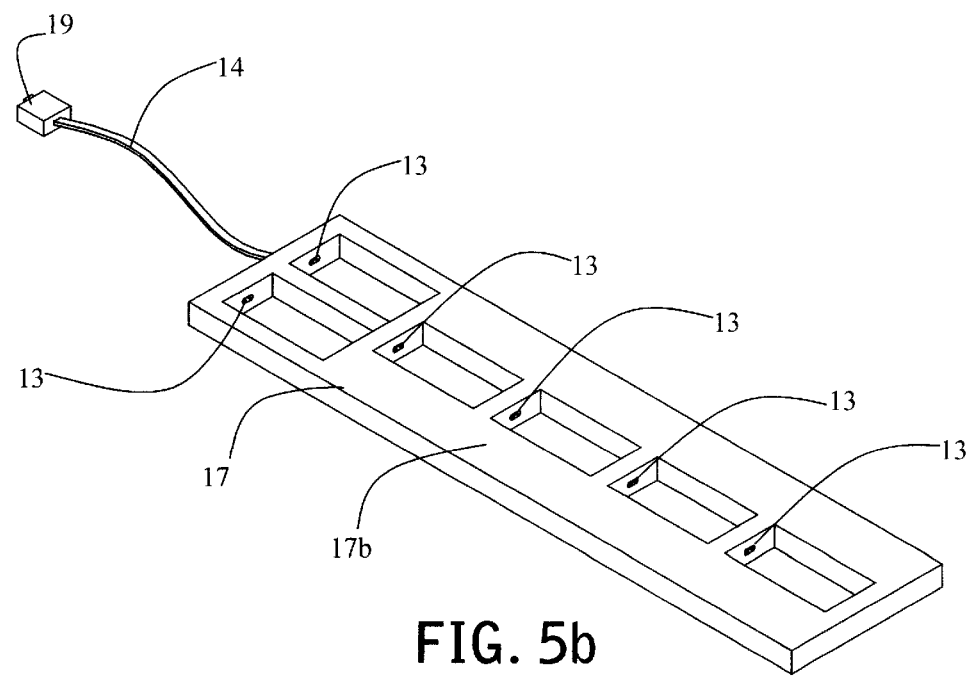
FIG. 5b illustrates an isometric view of a six-channel spine array cable holder.

FIG. 5b shows a spine array cable holder 17 which has an integrated soft pad 17b on which the patient can lie down on her back for a spine exam. This holder is used to make a six-channel spine array coil using six small loop coil elements 1. Before using this coil each element is first connected to it own mating location on the cable holder 13 and then dropped into the matching slot built into the cable holder. A flat cable 14 comes out of one end of the coil and carries the signals from the six elements to the system connector box 19.

Figure 6A:
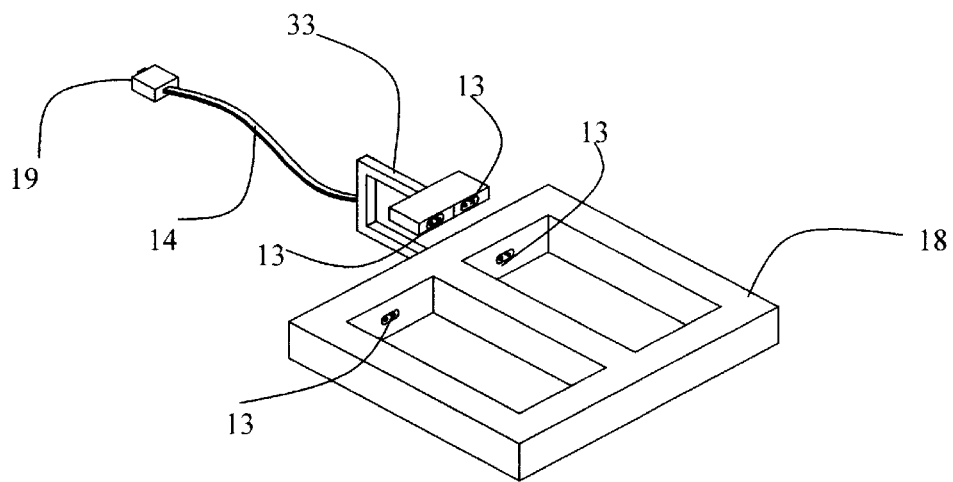
FIG. 6a illustrates an isometric view of a four-channel shoulder coil array cable holder.
Figure 6B:
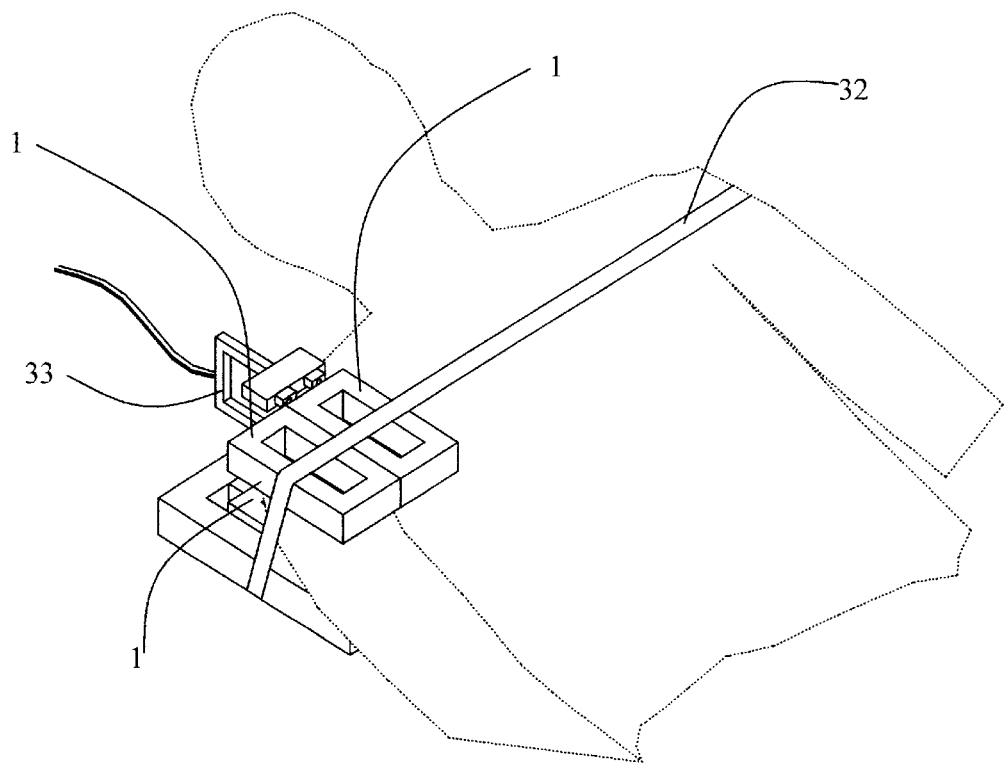
FIG. 6b illustrates the shoulder coil array cable holder populated with loop coil imaging elements and setup on the shoulder of a patient.

Four small loop coil elements 1 from the spine array can also be used to form a four-channel shoulder array coil. FIG. 6a shows the cable holder 18 for a four-channel shoulder array coil. Two elements are dropped in bottom pad while the upper two elements connect to the cables that come out of a semi rigid post 33. For shoulder exam using this array the patient first lies down on the imaging table and then the lower pad of the array is inserted under the shoulder, see FIG. 6b. Then the upper loop coil elements 1 are connected to the cable holder. The upper two coils can be freely moved two to four inches by the radiology technician for optimal placement over the region of interest. Elastic straps 32 and other similar means can be used to hold the upper coils elements in place after their location has been finalized.

Figure 7:
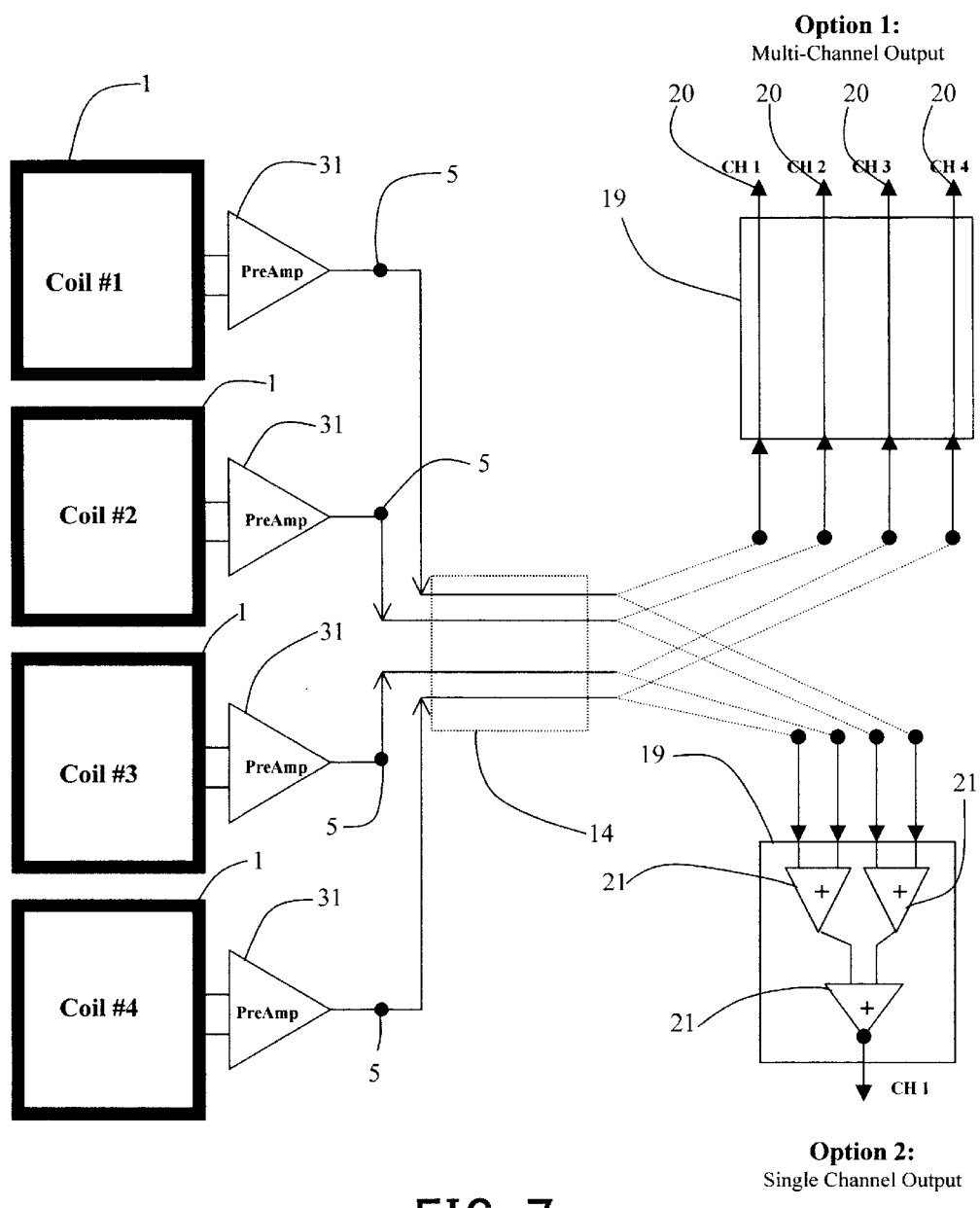
FIG. 7 illustrates the block diagram of a four channel array of the present invention with two system connector termination options—(1) four channel option and (2) single channel option.

The cable holders connect to the MRI scanner via the system connector box 19. Depending on the receiver design of the MRI scanner there are at least two options for the system connector box 19. FIG. 7 illustrates the two options in the case of a array coil that has four imaging coil elements of the present invention. The cable connections are shown by dotted line going to both types of system connector 19 boxes. Depending on the MRI scanner one of the two options will be used at a given time.

Some scanners have several receivers for handling signals emanating from each element of the array. If a scanner has such a multi-channel receiving capability then the system connector box 19 has the appropriate mating connectors 20 for transferring signals from each imaging coil element directly to the MRI scanner. This multi-channel output is called option 1 in FIG. 7.

If the MRI scanner can only receive a single signal channel then the outputs of the individual imaging coil elements are combined in an analog fashion using Wilkinson hybrid combiners 21 in the system connector box 19. Such hybrid combiners 21 are well known to those skilled in the art. This single-channel output is called option 2 in FIG. 7.

Accordingly, the reader will see that phased array coils of the present invention can be assembled easily by joining imaging coil elements to the cable holder specified for the desired array configuration. The elements can just as easily be removed from one array configuration and joined to another cable holder to form a second array configuration that may be totally different from the first one. This ability to share imaging coil elements allows the user to make several different array configurations from a few common parts. This is more desirable than investing in several different application specific phased arrays with dedicated imaging coil elements. Further, since the coils are de-coupled effectively by the low impedance preamplifier they do not have to rely on overlapping for minimizing inter-coil coupling. This allows a user considerable freedom in individual imaging coil placement without SNR degradation. All the improvements mentioned earlier make the imaging coil element extremely rugged and portable. It can be joined in various array configurations with consistent SNR performance from one array configuration to the other.

While several presently preferred embodiments and teachings of the present invention have been described in detail herein, many modifications and variations will now become obvious to those skilled in the art. It is my intent therefore to be limited only by the scope of appending claims and not by the specific detail presented by way of illustration.

I claim:

1. A magnetic resonance imaging (MRI) coil array cable holder apparatus, said apparatus comprising:
 a) an insulated cable assembly, said cable assembly having opposite ends;
 b) a plurality of receptacle shaped connectors, each including electrically conductive interconnects, substantially located on first end of said cable assembly;

c) a system connector box comprising means for connecting to the MRI scanner, substantially located on second end of said cable assembly;

d) said cable assembly further comprising means for simultaneously receiving MRI signals from each of said plurality of receptacle shaped connectors and transferring them to said system connector box;

whereby a MRI coil array is assembled by populating said plurality of receptacle shaped connectors with separable imaging coil elements.

2. The apparatus of claim 1 further comprising:

means, including low input impedance preamplifiers, for causing said imaging coil elements to operate in close proximity, with minimal interaction, of each other said without necessitating any overlapping between adjacent imaging coil elements.

3. The apparatus of claim 1 further comprising:

means, including adding circuits, for combining MRI signals received by two or more imaging coil elements.

4. The apparatus of claim 1, wherein said imaging coil elements are fabricated from flexible materials thereby allowing said imaging coils to closely conform to the patient anatomy.

5. The apparatus of claim 1, wherein said imaging coil elements are selected from the group comprising loop type imaging coils, figure eight shaped imaging coils, saddle shaped imaging coils and combinations thereof.

6. A MRI imaging coil array apparatus, said apparatus comprising:

a) an insulated cable assembly, said cable assembly having opposite ends;

b) at least one receptacle shaped connector, including electrically conductive interconnects, substantially located on first end of said cable assembly;

d) a system connector box comprising means for connecting to the MRI scanner, substantially located on second end of said cable assembly;

e) at least three imaging coil elements of which at least one is a separable imaging coil element, said imaging coil elements are substantially located on first end of said cable assembly;

f) said separable imaging coil element is connected to said cable assembly across said receptacle shaped connector;

g) said cable assembly further comprising means for simultaneously receiving MRI signals from said imaging coil elements and transferring them to said system connector box.

7. The apparatus of claim 6 further comprising:

means, including low input impedance preamplifiers, for causing said imaging coil elements to operate in close proximity, with minimal interaction, of each other said without necessitating any overlapping between adjacent imaging coil elements.

8. The apparatus of claim 6 further comprising:

means, including adding circuits, for combining MRI signals received by two or more of said imaging coil elements.

9. The apparatus of claim 6, where in said imaging coil elements are fabricated from flexible materials thereby allowing said imaging coil elements to closely conform to the patient anatomy.

10. The apparatus of claim 6, where in said imaging coil elements are selected from the group comprising loop type imaging coils, figure eight shaped imaging coils, saddle shaped imaging coils and combinations thereof.

11. A method for assembling MRI coil arrays for receiving radio frequency MRI signals from a shared set of common parts thereby minimizing number of dedicated parts used for assembling each coil array, said method comprising the steps of:

a) providing a collection of separable imaging coil elements, each having a plug interface, including conductive connectors;

b) providing a collection of cable holders, each having a plurality of receptacle shaped connectors, including conductive interconnects, that are capable of mating with said plug interface;

c) joining three or more of said separable imaging coil elements to one of said cable holders across predetermined said receptacle shaped connectors using said plug interface to form a coil array;

whereby it is possible to remove one or more of said separable imaging coil elements from one coil array and use them in assembling another coil array.

12. Method of claim 11, further comprising the steps of providing means, including low input impedance preamplifiers, for causing said separable imaging coil elements to operate in close proximity, with minimal interaction, of each other without necessitating any overlapping between adjacent said separable imaging coil elements.

13. Method of claim 11, further comprising the step of:

providing means, including adding circuits, for combining MRI signals received by two or more of said separable imaging coil elements.

14. Method of claim 11, further comprising the step of:

fabricating said separable imaging coil elements from flexible materials such that they can closely conform to the patient anatomy.

15. Method of claim 11, further comprising the step of:

selecting said separable imaging coil elements from the group comprising loop type imaging coils, figure eight shaped imaging coils, saddle shaped imaging coils and combinations thereof.

* * * * *